(12) United States Patent
Tsuruyama et al.

(10) Patent No.: US 11,374,556 B2
(45) Date of Patent: Jun. 28, 2022

(54) LOGIC CIRCUIT, SEQUENCE CIRCUIT, POWER SUPPLY CONTROL CIRCUIT, SWITCHING POWER SUPPLY DEVICE

(71) Applicant: Rohm Co., Ltd., Kyoto (JP)

(72) Inventors: Genki Tsuruyama, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 137 days.

(21) Appl. No.: 16/753,458

(22) PCT Filed: Oct. 1, 2018

(86) PCT No.: PCT/JP2018/036689
§ 371 (c)(1),
(2) Date: Apr. 3, 2020

(87) PCT Pub. No.: WO2019/073840
PCT Pub. Date: Apr. 18, 2019

(65) Prior Publication Data
US 2020/0321947 A1  Oct. 8, 2020

(30) Foreign Application Priority Data

Oct. 10, 2017 (JP) .............................. JP2017-197076
Oct. 10, 2017 (JP) .............................. JP2017-197077

(51) Int. Cl.
*H02M 3/156* (2006.01)
*H03K 3/017* (2006.01)
(Continued)

(52) U.S. Cl.
CPC ............ *H03K 3/017* (2013.01); *H02M 3/156* (2013.01); *H03K 5/04* (2013.01); *H03K 5/153* (2013.01)

(58) Field of Classification Search
CPC ........ H03K 3/017; H03K 3/0375; H03K 5/04; H03K 5/153; H02M 3/156; H02M 3/158
See application file for complete search history.

(56) References Cited

U.S. PATENT DOCUMENTS 6,445,635 B1 * 9/2002 Au .............................. G06F 5/12
365/221
2013/0141148 A1 6/2013 Ishii et al.

FOREIGN PATENT DOCUMENTS

| JP | 2002-208844 | 7/2002 |
|----|-------------|--------|
| JP | 2008-176440 | 7/2008 |
| JP | 2013-118449 | 6/2013 |

OTHER PUBLICATIONS

Japan Patent Office, International Search Report for PCT/JP2018/036689 dated Dec. 25, 2018 with English translation.

* cited by examiner

*Primary Examiner* — Sibin Chen
(74) *Attorney, Agent, or Firm* — Fish & Richardson P.C.

(57) ABSTRACT

A sequence circuit (1) includes a detector (2) that detects an occurrence of an event based on an input signal, an acceptor (4) that accepts the event whose occurrence has been detected by the detector, an inhibitor (4) that inhibits the acceptor from accepting another event for a first period using the acceptance of one event by the acceptor as a trigger, a clock pulse generator (3) that generates one or more clock pulses during a period after a second period shorter than the first period elapses from the start of the first period until the first period ends, a determiner (5) that determines a next state based on a current slate and the event accepted by the acceptor, and a latch (6) that latches the next state using the clock pulse. An output of the latch is the current state.

17 Claims, 9 Drawing Sheets

(51) Int. Cl.
*H03K 5/04* (2006.01)
*H03K 5/153* (2006.01)

LOGIC CIRCUIT, SEQUENCE CIRCUIT, POWER SUPPLY CONTROL CIRCUIT, SWITCHING POWER SUPPLY DEVICE

TECHNICAL FIELD

The present invention relates to a sequence circuit, and a power supply control circuit and a switching power supply device using the sequence circuit. Further, the present invention relates to a logic circuit, and a sequence circuit, a power supply control circuit, and a switching power supply device using the logic circuit.

BACKGROUND ART

Conventionally, in order to achieve low power consumption of a logic circuit, a clock gating technique is used (e.g., see Patent Document 1).

In a logic circuit, besides the low power consumption, glitch output prevention is also an important technical issue. Here, in the logic circuit illustrated in FIG. 10, it is supposed that a latch 101 and an output decoder 102 are connected with two buses, and an output state of the latch 101 is changed from 00 to 11. In this case, the output state of the latch 101 may be 01 or 10 on the way of changing from 00 to 11. For instance, if the output decoder 102 is an XOR gate, when the output state of the latch 101 becomes 01 or 10 on the way of changing from 00 to 11, a glitch occurs in the output of the output decoder 102.

In the logic circuit illustrated in FIG. 10, it is possible to prevent a glitch output by disposing a glitch elimination circuit disclosed in Patent Document 2, for example, in a post-stage of the output decoder 102.

LIST OF CITATIONS

Patent Literature

Patent Document 1: JP-A-2008-176440
Patent Document 2: JP-A-2002-208844

SUMMARY OF THE INVENTION

Technical Problem

In the clock gating technique, power consumption is reduced by controlling supply of a clock signal, but there is a problem that power consumption in a clock signal generator cannot be suppressed because the clock signal generator for generating the clock signal always operates.

When the glitch elimination circuit disclosed in the Patent Document 2 is disposed in the post-stage of the output decoder 102, a noise may affect the glitch elimination circuit and cause abnormal operation thereof. As a result, the output of the glitch elimination circuit may become irrelevant to the output state of the latch 101, and hence the control using the output of the logic circuit may become disabled.

As illustrated in FIG. 11, even if a delay circuit 103 and a latch 104 are added to the logic circuit illustrated in FIG. 10, there is the same concern.

A first object of the present invention is, in view of the above mentioned situation, to provide a sequence circuit, and a power supply control circuit find a switching power supply device using the sequence circuit, in which power consumption can be further reduced.

A second object of the present invention is, in view of the above mentioned situation, to provide a logic circuit, and a sequence circuit, a power supply control circuit, and a switching power supply device using the logic circuit, in which glitch output can be prevented, and an out-of-control state does not occur.

Means for Solving the Problem

A sequence circuit disclosed in this specification includes a detector arranged to detect an occurrence of an event on the basis of an input signal, an acceptor arranged to accept the event whose occurrence has been detected by the detector, an inhibitor arranged to inhibit the acceptor from accepting another event for a first period using the acceptance of one event by the acceptor as a trigger, a clock pulse generator arranged to generate one or more clock pulses during a period after a second period shorter than the first period elapses from the start of the first period until the first period ends, a determiner arranged to determine a next slate on the basis of a current state and the event accepted by the acceptor, and a latch arranged to latch the next state using the clock pulse, in which an output of the latch is the current state (first structure).

In the sequence circuit having the first structure described above, an occurrence timing of the event may not be synchronized with any clock signal (second structure).

In the sequence circuit having the first or the second structure described above, the inhibitor may inhibit the acceptor front accepting every event after the end of the first period until a third period elapses (third structure).

In the sequence circuit having any one of the first to third structures described above, the detector may detect a type of the event on the basis of the current state and a state of the input signal and inform the acceptor of the type of the event (fourth structure).

In the sequence circuit having anyone of the first to fourth structures described above, the second period may lie longer than a setup time of the latch (fifth structure).

In the sequence circuit having the fifth structure, the second period may be longer than a total time of a time necessary for decay of a metastable state of the acceptor and the setup time of the latch (sixth structure).

In the sequence circuit having any one of the first to sixth structures described above, the detector may detect the occurrence of the event on the basis of a level of the input signal (seventh structure).

In the sequence circuit having any one of the first to seventh structures described above, the clock pulse generator may change a length of the second period in accordance with an operating environment temperature of the sequence circuit (eighth structure).

Further, a power supply control circuit disclosed in this specification, which controls a state of a switching power supply device, includes the sequence circuit having any one of the first to eighth structures described above (ninth structure).

In the power supply control circuit having the ninth structure, the clock pulse generator may change a length of the second period in accordance with an input voltage of the switching power supply device (tenth structure).

Further, a switching power supply device disclosed in tins specification includes the power supply control circuit having the eighth or ninth structure, and a switch output stage arranged to generate an output voltage of the switching power supply device from an input voltage of (lie switching power supply device (eleventh structure).

A logic circuit disclosed in this specification includes a latch arranged to latch a state of an input signal using a clock pulse, a first combinational logic arranged to generate and output a signal corresponding to a state of a signal output from the latch, a second combinational logic arranged to generate and output a signal corresponding to a state of the same signal as the input signal to the latch, a selector arranged to select and output one of an output signal of the first combinational logic and an output signal of the second combinational logic, in which the first combinational logic and the second combinational logic have the same logic structure (twelfth structure).

In the logic circuit having the twelfth structure described above, the selector may switch a signal to be selected from the output signal of the first combinational logic to the output signal of the second combinational logic, immediately before or at the same time as a state of the signal latched by the latch changes, and later return the signal to be selected to the output signal of the first combinational logic (thirteenth structure).

In the logic circuit having the thirteenth structure described above, a period, which is after the selector switches the signal to be selected from the output signal of the first combinational logic to the output signal of the second combinational logic until the selector returns the signal to be selected to the output signal of the first combinational logic, may be substantially the same length as a time corresponding to a pulse width of the clock pulse (fourteenth structure).

Further, another sequence circuit disclosed in this specification includes the logic circuit having any one of the twelfth to fourteenth structures, and a determiner arranged to determine a state of a signal input to the latch on the basis of a state of a signal output from the latch and an event (fifteenth structure).

Further, another power supply control circuit disclosed in this specification, which controls a slate of a switching power supply device, includes the sequence circuit having the fifteenth structure described above (sixteenth structure).

Further, another switching power supply device disclosed in this specification includes the power supply control circuit having the sixteenth structure described above, and a switch output stage arranged to generate an output voltage of the switching power supply device from an input voltage of the switching power supply device (seventeenth structure).

Advantageous Effects of the Invention

According to one aspect of the invention disclosed in this specification, it is possible to provide a sequence circuit, and a power supply control circuit and a switching power supply device using the sequence circuit, in which lower power consumption can be achieved.

According to another aspect of the invention disclosed in this specification, it is possible to provide a logic circuit, and a sequence circuit, a power supply control circuit, and a switching power supply device using the logic circuit, in which glitch output can be prevented, and an out-of-control state does not occur.

DESCRIPTION OF EMBODIMENTS

1. Sequence Circuit According to First Embodiment

Figure 1:
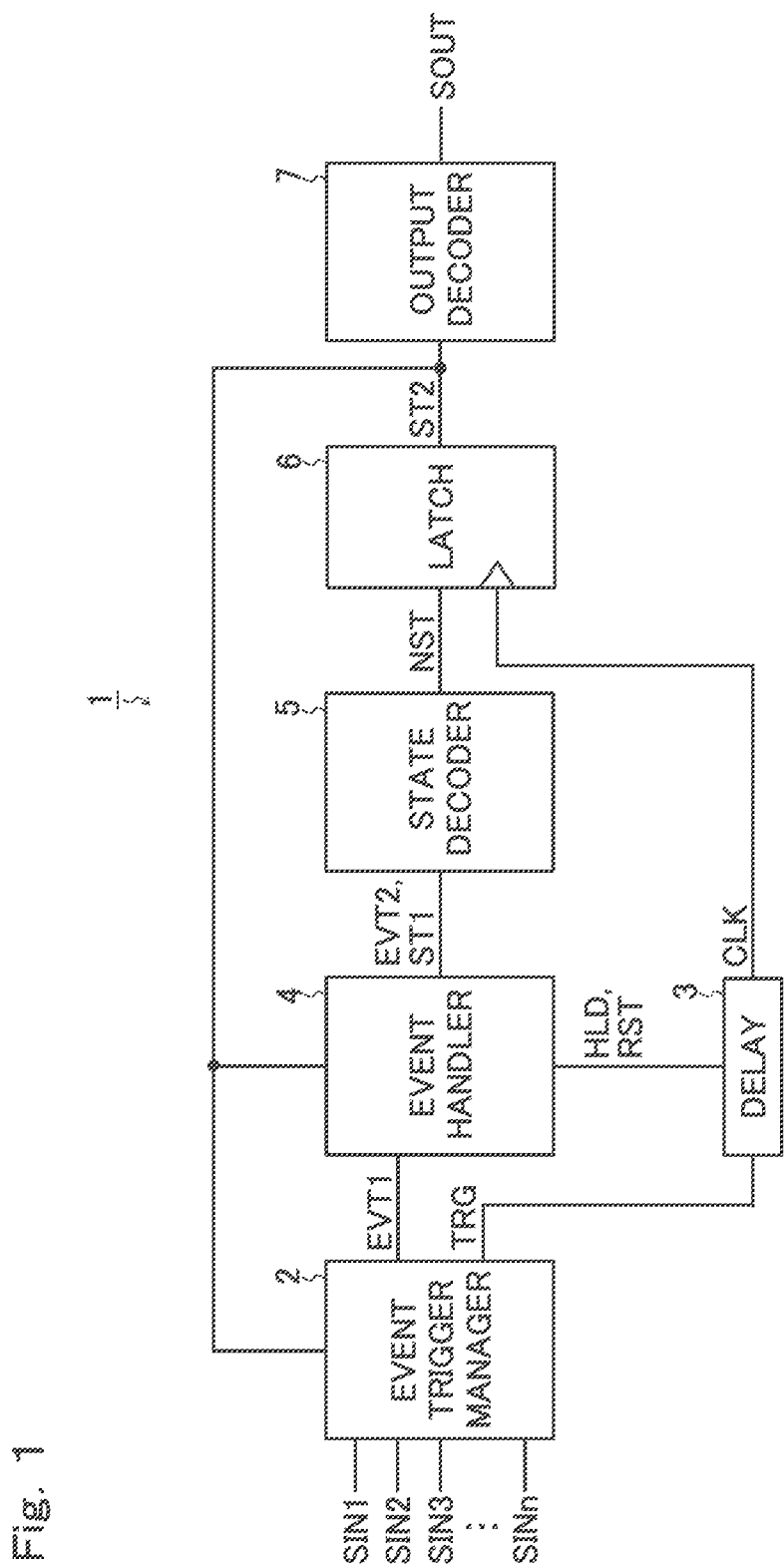
FIG. 1 is a block diagram illustrating a structure of a sequence circuit according to a first embodiment.

FIG. 1 is a block diagram illustrating a structure of a sequence circuit according to a first embodiment. A sequence circuit 1 according to the first embodiment (hereinafter referred to as a sequence circuit 1) includes an event trigger manager 2, a delay unit 3, an event handler 4, a state decoder 5, a latch 6, and an output decoder 7.

The event trigger manager 2 corresponds to one example of a "detector" described in the claims. The event handler 4 corresponds to one example of an "acceptor" and an "inhibitor" described in the claims. The delay unit 3 corresponds to one example of a "clock pulse generator" described in the claims. The state decoder 5 corresponds to one example of a "determiner" described m the claims. The latch 6 corresponds to one example of a "latch" described in the claims.

The event trigger manager 2 is a combinational logic circuit that performs logical operation of determining which event corresponds to a suite of a plurality of input signals SIN1 to SINn (n is a natural number more than one) in a current slate indicated by a state signal ST2.

The event trigger manager 2 outputs to the delay unit 3 an event trigger signal TRG including information indicating an occurrence of an event. Further, the event trigger manager 2 outputs to the event handler 4 an event signal EVT1 indicating a type of the event.

It is not particularly limited which type of signal each input signal SINk (k is a natural number) is, but a case where an output signal of a comparator is used is considered, for example. Note that, for example, in a case where the sequence circuit 1 or a sequence circuit 10 described later is used as at least a part of a power supply control circuit that controls a state of a switching power supply device, or other case, an occurrence timing of the event is not synchronized with any clock signal.

In this structural example, the state of the plurality of input signals SIN1 to SINn in the current state indicated by the state signal ST2 corresponds to a type of the event, but it may be possible to adopt a structure in which the type of the event is determined only by the state of the plurality of input signals SIN1 to SINn, regardless of the current state indicated by the state signal ST2. Note that, when adopting this structure, the state signal ST2 may not be supplied to the event trigger manager 2. Further, the event trigger manager 2 is supplied with the plurality of input signals SIN1 to SINn in this structural example, but it may be possible to adopt a structure in which the event trigger manager 2 is supplied with a single input signal.

The delay unit 3 generates a clock pulse with a delay front an occurrence of the event on the basis of the event trigger signal TRG, and supplies a clock signal CLK including the generated clock pulse to the latch 6. Further, the delay unit 3 generates a hold signal HLD on the basis of the event trigger signal TRG, the hold signal HLD being for setting the event handler 4 to a hold state using the event occurrence as a trigger and for releasing the hold state of the event handler 4 after a further delay from the generation of the clock pulse, so as to supply the generated hold signal HLD to the event handler 4. Furthermore, the delay unit 3 supplies the event handler 4 with a reset signal RST for inhibiting the event handler 4 from accepting every event during a period after the timing when the hold state of the event handler 4 is released until a certain period elapses. Unlike this example, the reset signal RST may be generated inside the event handler 4.

The event handler 4 becomes the hold state in which accepting other events (except the one event) is inhibited for a predetermined period using the acceptance of one event as a trigger, on the basis of the hold signal HLD. Further, the event handler 4 accepts the current state indicated by the state signal ST2 at the timing when the one event is accepted, on the basis of the bold signal HLD, and holds the accepted one event and the accepted current state during the hold state. Further, the event handler 4 outputs to the state decoder 5 an event signal EVT2 indicating a type of the accepted event and a state signal ST1 indicating the accepted current state Note that a plurality of events can occur at the same time. Therefore, u is preferred that the state decoder 5 should have a structure in which priorities of the events are specified for each current state indicated by the state signal ST2, and if a plurality of events occur at the same time, only an event having the highest priority is accepted among the plurality of events that occurred at the same time. It may be possible to adopt a structure in which instead of the slate decoder 5, the event handler 4 specifies priorities of the events for each current state indicated by the suite signal ST2, and if a plurality of events occur at the same time, only an event having the highest priority is accepted among the plurality of events that occurred at the same time.

The state decoder 5 is a combinational logic circuit that performs logical operation of generating a state Signal NST indicating a next state from the state signal ST1 indicating the current state accepted by the event handler 4 and the event signal EVT2 indicating the event accepted by the event handler 4. The state decoder 5 outputs the state signal NST indicating the next state to the latch 6.

The latch 6 latches the next state using the clock pulse included in the clock signal CLK. An output of the latch 6 is supplied as the state signal ST2 indicating the current state to the event trigger manager 2, the event handler 4, and the output decoder 7.

The output decoder 7 is a combinational logic circuit that performs logical operation of generating an output signal SOUT from the state signal ST2 indicating the current slate.

Figure 2:
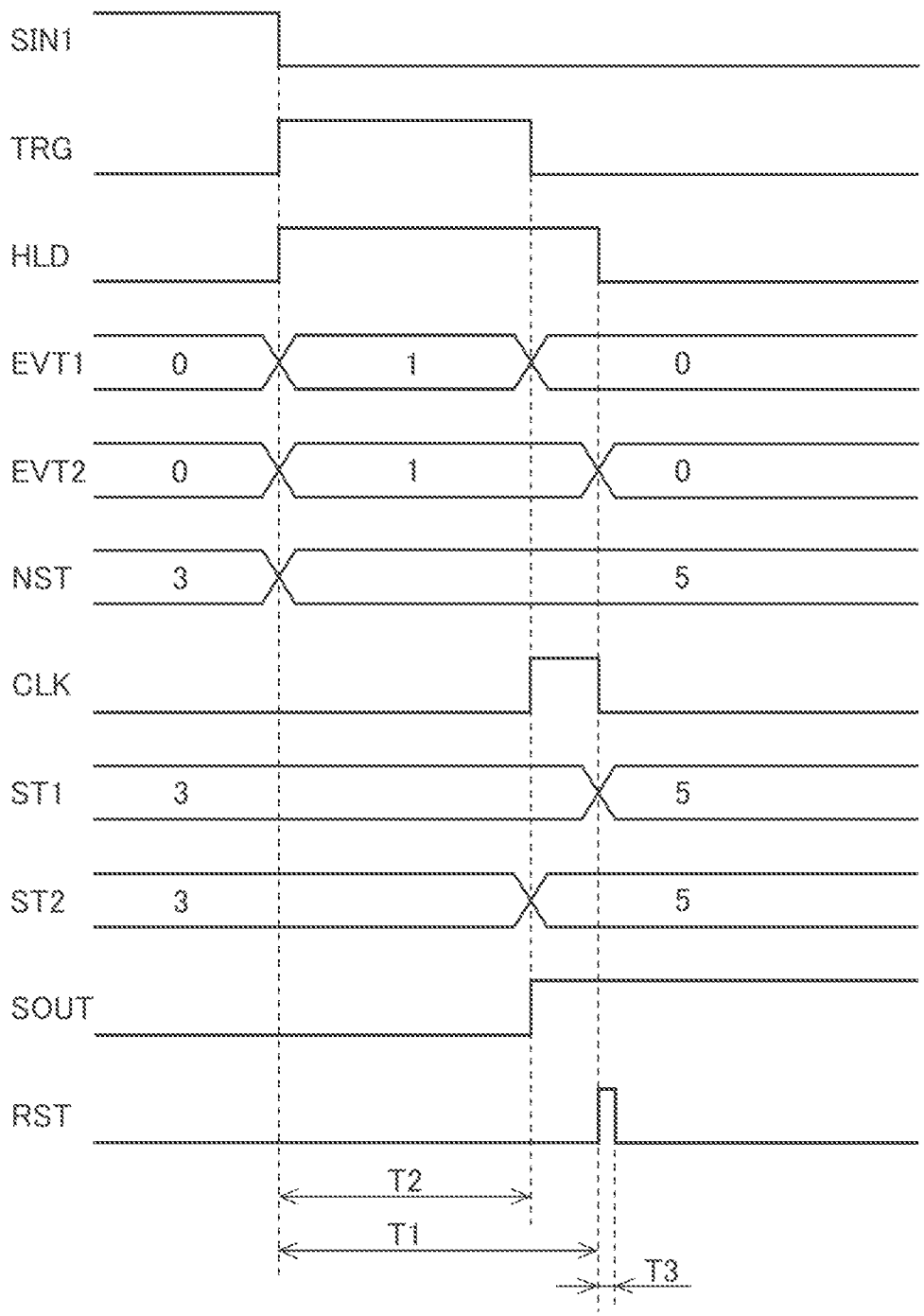
FIG. 2 is a timing chart illustrating an operation example of the sequence circuit illustrated in FIG. 1.

FIG. 2 is a timing chart illustrating an operation example of the sequence circuit illustrated in FIG. 1. In FIG. 2, it is supposed that if the slate signal ST2 indicating the current state is "3" and if the input signal SIN1 is LOW level, an event in which the event signal EVT1 is "1" has occurred.

When the event trigger manager 2 detects LOW level of the input signal SIN1, it switches the event trigger signal TRG from LOW level to HIGH level. After that, when the state signal ST2 is changed, the event trigger manager 2 returns the event trigger signal TRG from HIGH level to LOW level.

The delay unit 3 switches the hold signal HLD from LOW level to HIGH level at a time point when the event trigger signal TRG is switched from LOW level to HIGH level. When a hold period T1 elapses after the hold signal HLD is switched from LOW level to HIGH level, the delay unit 3 returns the hold signal HLD from HIGH level to LOW level. Note that the hold period T1 is set to be longer than the delay time T2.

As described above, if the state signal ST2 indicating the current suite is "3" and if the input signal SIN1 is LOW level, the event signal EVT1 is "1". Note that if no event has occurred, the event signal EVT1 is "0".

If the state signal ST1 indicating the current state accepted by the event handler 4 is "3" and if the event signal EVT2 indicating the event accepted by the event handler 4 is "1", the state decoder 5 sets the state signal NST indicating the next state to "5". Therefore, when the event trigger signal TRG switches from LOW level to HIGH level, the state signal NST indicating the next state is switched from "3" to "5".

When the delay time T2 elapses from the time point when the event trigger signal TRG switches front LOW level to HIGH level, the delay unit 3 switches the clock signal CLK from LOW level to HIGH level. When the hold period T1 elapses after the hold signal HLD is switched from LOW level to HIGH level, the delay unit 3 returns the clock signal CLK from HIGH level to LOW level. Thus, a single clock pulse is generated. A rising edge of the clock pulse causes the latch 6 to perform a latch operation, and the state signal ST2 indicating the current state is switched from "3" to "5". Further, in response to the switching of the state signal ST2 indicating the current state from "3" to "5", the output signal SOUT is switched from LOW level to HIGH level. Further, when the hold period T1 ends, the delay unit 3 sets the reset signal RST to HIGH level only for a predetermined period 13. The predetermined period T3 is shorter than the hold period T1. For instance, lire predetermined period T3 should be set to be shorter than a period corresponding to the pulse width of the clock pulse included in the clock signal CLK.

Note that in order to prevent a malfunction in the latch 6, the delay time T2 is set to be longer than a setup time of the latch 6 in this embodiment. More specifically, in order to prevent the latch 6 from latching the state signal NST when the state signal NST is in an undefined state, the delay time T2 is set to be longer than a total time of a time necessary for decay of a metastable state of the event handler 4 and the setup time of the latch 6.

On the other hand, as the delay time T2 is longer, the process in the sequence circuit 1 is delayed more. Therefore, it is desired that the delay time T2 should be short as much as possible.

Figure 3:
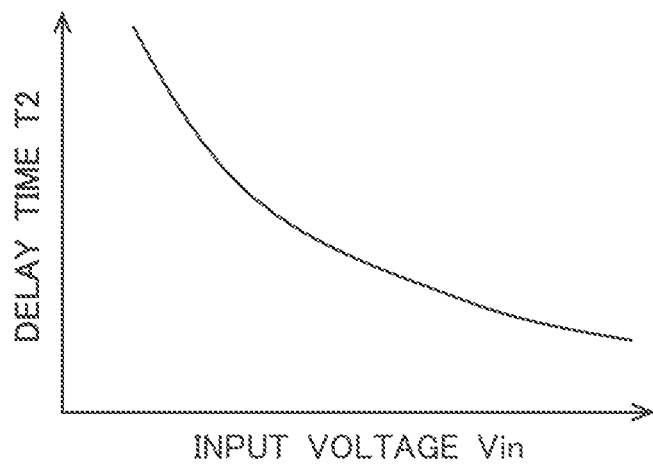
FIG. 3 is a graph illustrating a relationship between a delay time and an input voltage.
Figure 4:
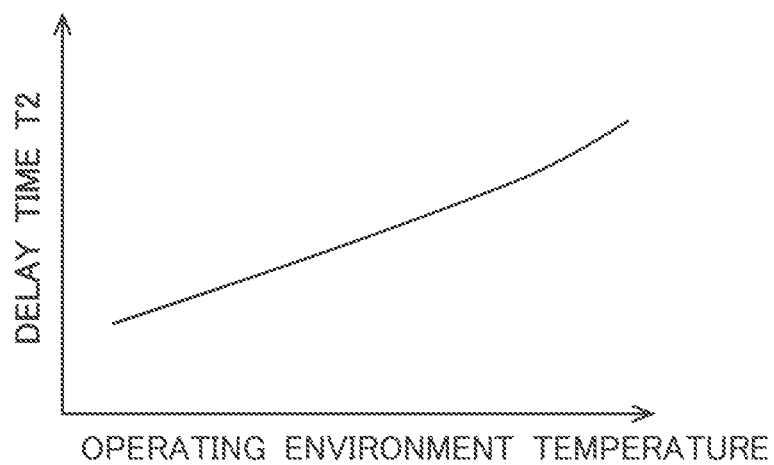
FIG. 4 is a graph illustrating a relationship between the delay time and an operating environment temperature.

Therefore, in consideration of input voltage characteristics of the setup time of the latch 6 and the time necessary for decay of a metastable state of the event handler 4, it may be possible to change the length of the delay time T2 in accordance with an input voltage Vin. For instance, if the setup time of the latch 6 and the time necessary for decay of a metastable state of the event handler 4 are longer as the input voltage Vin is lower, the delay time T2 should be longer as the input voltage Vin is lower, as shown in FIG. 3. On the contrary, if the setup time of the latch 6 and the time necessary for decay of a metastable state of the event handler 4 are shorter as the input voltage Vin is lower, the delay time T2 should be shorter as the input voltage Vin is lower. In this case, the delay unit 3 should obtain information about the input voltage Vin. Note that the input voltage Vin is an input voltage of the switching power supply device when mounting in the switching power supply device that includes the sequence circuit 1. Further, in consideration of temperature characteristics of the setup time of the latch 6 and the time necessary for decay of a metastable state of the event handler 4, it may be possible to change the length of the delay time T2 in accordance with the operating environment temperature. For instance, if the setup time of the latch 6 and the time necessary for decay of a metastable state of the event handler 4 are longer as the operating environment temperature is higher, the delay time T2 should be longer as the operating environment temperature is higher, as illustrated in FIG. 4. On the contrary, if the setup time of the latch 6 and the time necessary for decay of a metastable slate of the event handler 4 are shorter as the operating environment temperature is higher, the delay time T2 should be shorter as the operating environment temperature is higher. In this case, the delay unit 3 should obtain information about the operating environment temperature of the sequence circuit 1.

Note that it may possible to combine and perform adjustment of the delay time T2 in accordance with the input voltage Vin described above and adjustment of the delay time T2 in accordance with the operating environment temperature of the sequence circuit 1 described above.

The sequence circuit 1 described above is not required to generate the clock pulse regularly and periodically during operation of the sequence circuit 1, and hence power consumption can be reduced compared with a structure using a clock gating technique.

2. Sequence Circuit According to Second Embodiment

Figure 5:
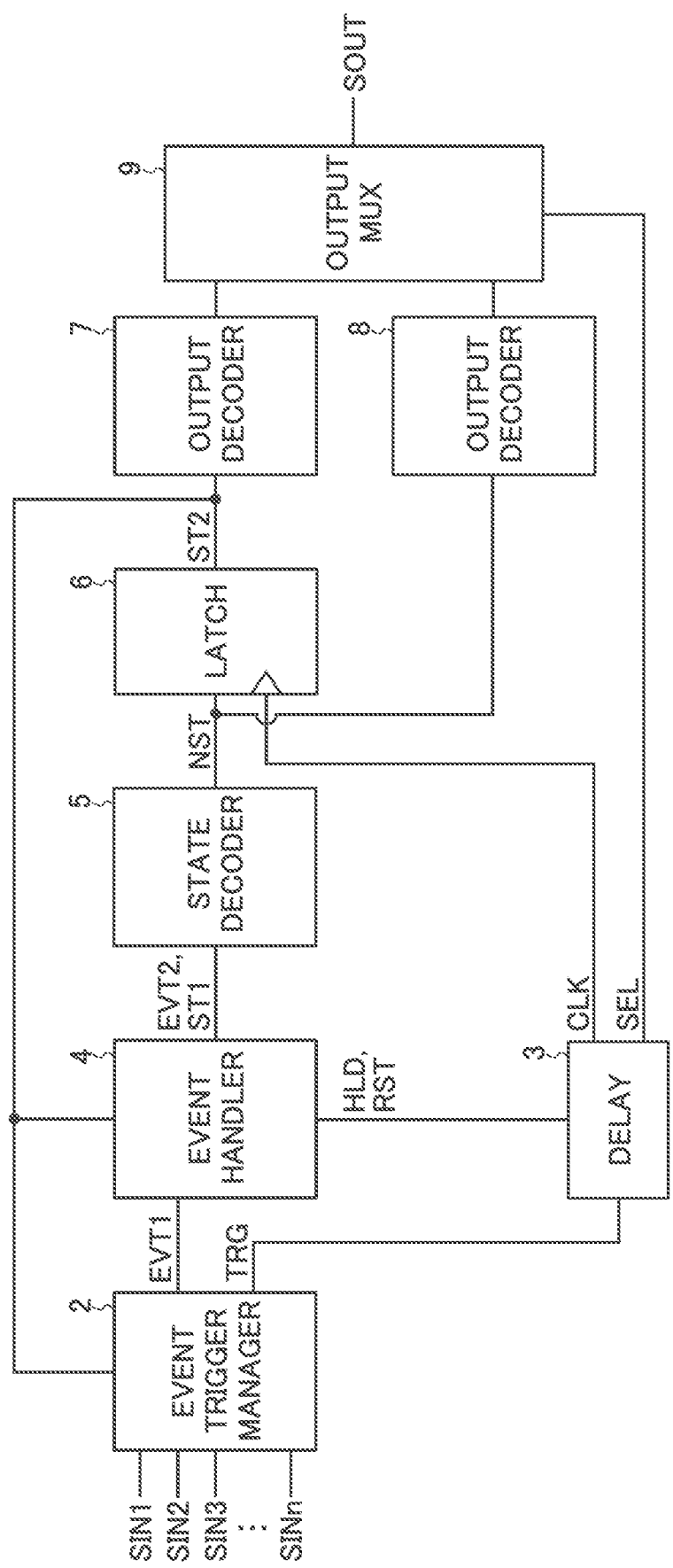
FIG. 5 is a block diagram illustrating a structure of the sequence circuit according to a second embodiment.

FIG. 5 is a block diagram illustrating a structure of the sequence circuit according to a second embodiment. The sequence circuit 10 according to the second embodiment includes the event trigger manager 2, the delay unit 3, the event handler 4, the state decoder 5, the latch 6, output decoders 7 and 8, and an output multiplexer 9. In FIG. 5, the same part as in FIG. 1 is denoted by the same numeral or symbol, and detailed description thereof is omitted.

The output decoder 7 corresponds to one example of a "first combinational logic" described in the claims. The output decoder 8 corresponds to one example of a "second combinational logic" described in the claims. The output multiplexer 9 corresponds to one example of a "selector" described in the claims.

In this embodiment, besides the operation described above in the first embodiment, the delay unit 3 supplies the output multiplexer 9 with a selection signal SEL that is a signal slightly advanced from the clock signal CLK.

Note that the selection signal SEL is the signal slightly advanced from the clock signal CLK in this embodiment, but if may be possible that the selection signal SEL is the same signal as the clock signal CLK.

In this embodiment, the output decoder 7 performs a logical operation of generating a decode signal instead of the output signal SOUT from the state signal ST2 indicating the current state.

The output decoder 8 is a combinational logic circuit that performs a logical operation of generating a decode signal from the state signal NST indicating the next state.

The output decoder 7 and the output decoder 8 have the same logic structure. In other words, the output decoder 7 and the output decoder 8 have the same input and output characteristics.

The output multiplexer 9 selects one of the decode signal output from the output decoder 7 and the decode signal output from the output decoder 8 on the basis of the selection signal SEL, and outputs the selected signal as the output signal SOUT.

Figure 6:
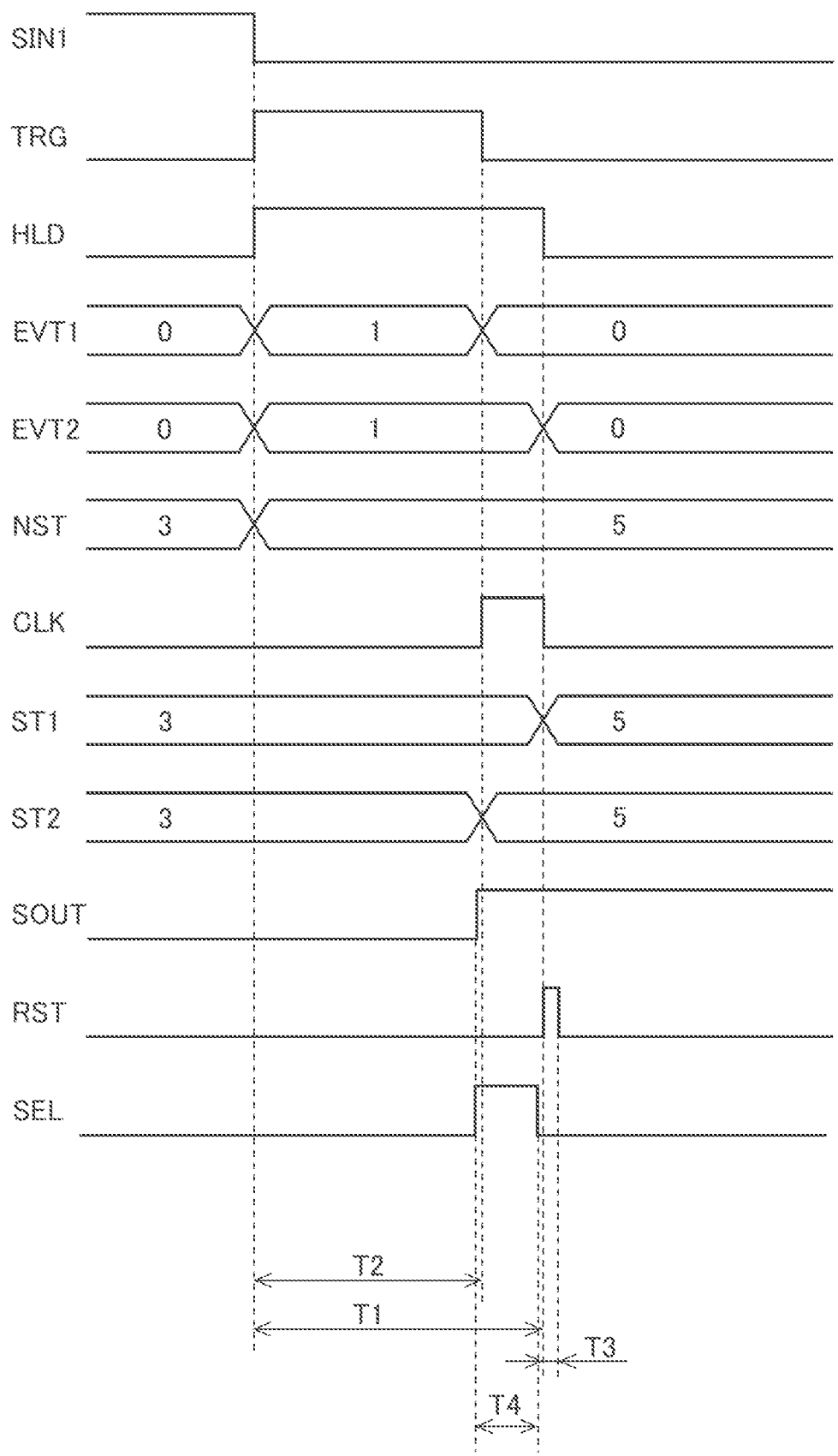
FIG. 6 is a timing chart illustrating an operation example of the sequence circuit illustrated in FIG. 5.

FIG. 6 is a timing chart illustrating an operation example of the sequence circuit 10. Similarly to FIG. 2, also in FIG. 6, it is supposed that if the state signal ST2 indicating the current state is "3" and if the input signal SIN1 is LOW level, an event in which the event signal EVT1 is "1" has occurred. Note that in the operation example of the sequence circuit 10 illustrated in FIG. 6, detailed description of the same part as the operation example of the sequence circuit 1 illustrated in FIG. 2 is omitted.

The selection signal SEL rises immediately before the clock signal CLK rises, and falls immediately before the clock signal CLK fails. Therefore, a period T4 while the selection signal SEL is HIGH level is substantially the same length as a time corresponding to the pulse width of the clock pulse included in the clock signal CLK.

If the selection signal SEL is HIGH level the output multiplexer 9 outputs the decode signal output from the output decoder 8, as the output signal SOUT. Further, if the selection signal SEL is LOW level, the output multiplexer 9 outputs the decode signal output from the output decoder 7, as the output signal SOUT. In other words, by the latch operation of the latch 6, only when the state of the state signal ST2 output from the latch 6 is changing, a signal obtained by decoding the state signal NST input to the latch 6 becomes the output signal SOUT, and otherwise a signal obtained by decoding the state signal ST2 output from the latch 6 becomes the output signal SOUT.

In this way, when the state of the state signal ST2 output from the latch 6 is changing, even if a glitch occurs in the decode signal output from the output decoder 7, it is possible to prevent a glitch from appearing in the output signal SOUT. Further, the period (period T4) in which the output signal SOUT has no relationship with the state signal ST2 output from the latch 6 is temporary, and when the period T4 ends, the state is restored in which the output signal SOUT corresponds to the state signal ST2 output from the latch 6. Therefore, there is no possibility that the control using the output signal SOUT becomes disabled.

Similarly to the sequence circuit 1, the sequence circuit 10 can reduce power consumption compared with the structure using the dock gating technique. Further, the logic circuit constituted of the latch 6, the output decoders 7 and 8, and the output multiplexer 9 as described above can prevent a glitch output and does not cause an out-of-control state.

3. Application to Switching Power Supply Device

Figure 7:
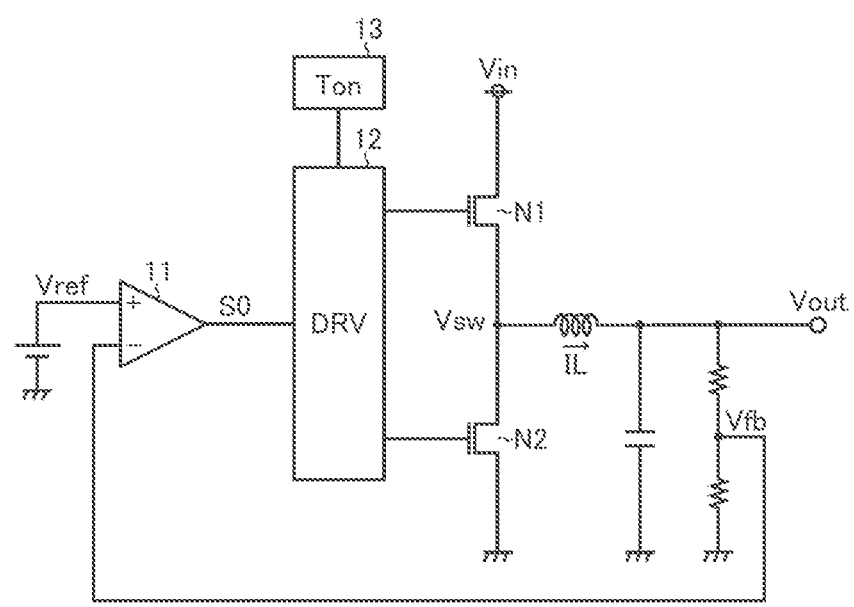
FIG. 7 is a diagram illustrating one structural example of a switching power supply device of a bottom detection on-time fixed method.

The sequence circuit 1 or the sequence circuit 10 described above can be applied to the switching power supply device of a bottom defection on-time fixed method illustrated in FIG. 7, for example. The switching power supply device of a bottom detection on-time fixed method illustrated in FIG. 7 is a step-down type DC/DC converter that steps down the input voltage Vin so as to generate a desired output voltage Vout.

In the switching power supply device of a bottom detection on-time fixed method illustrated in FIG. 7, when it is detected that a feedback voltage Vfb is decreased down to a reference voltage Vref, a driver 12 turns on an upper side transistor N1 so that the switch voltage Vsw becomes HIGH level for a predetermined ON time Ton, on the basis of an output of an ON time setting circuit 13 that sets the predetermined ON time Ton. Note that the driver 12 turns off the upper side transistor N1 in other time than the predetermined ON time Ton. Further, the upper side transistor N1 and a lower side transistor N2 are complementarily switched by the driver 12.

Further, in the switching power supply device of a bottom detection on-time fixed method illustrated in FIG. 7, in order to realize an overcurrent protection function, an overheat protection function, and the like, the driver 12 performs operations corresponding to outputs of a current sensor, a temperature sensor, and the like.

The driver 12 is a power supply control circuit that controls a slate of the switching power supply device of a bottom detection on-time fixed method, and the sequence circuit 1 or the sequence circuit 10 described above can be used as at least a part of the driver 12.

Note that each of the sequence circuit 1 and the sequence circuit 10 described above can also be used for a switching power supply device other than the bottom detection on-time fixed switching power supply device. Further, each of the sequence circuit 1 and the sequence circuit 10 described above can be used not only for the switching power supply device but also for a motor driving device and the like, for example.

4. Application to TV Set

Figure 8:
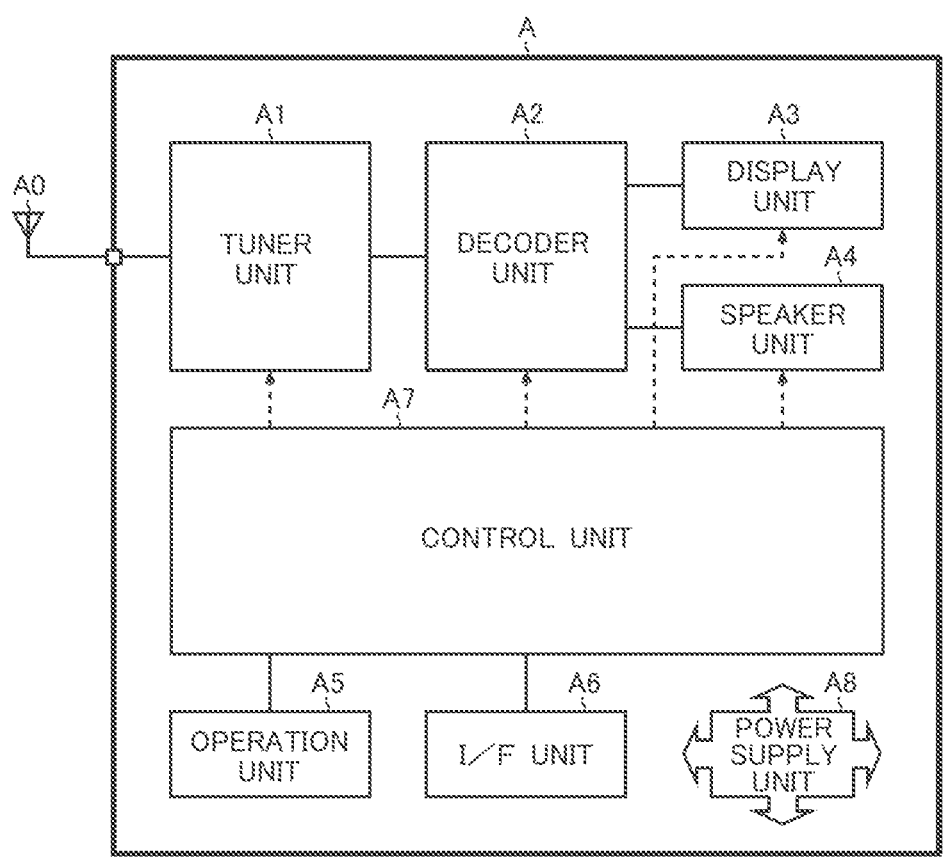
FIG. 8 is a block diagram illustrating one structural example of a TV set including the switching power supply device.
Figure 9A:
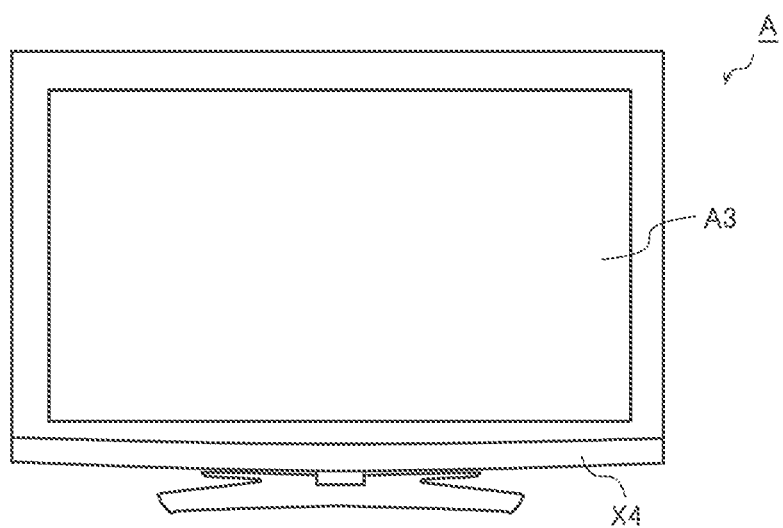
FIG. 9A is a front view of the TV set including the switching power supply device.
Figure 9B:
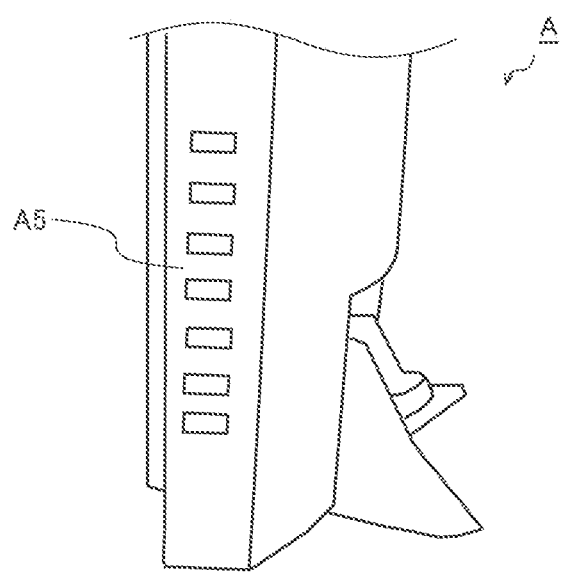
FIG. 9B is a side view of the TV set including the switching power supply device.
Figure 9C:
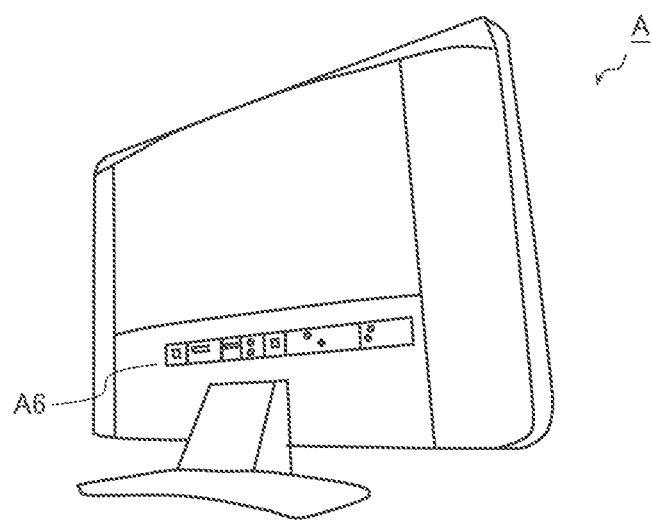
FIG. 9C is a rear view of the TV set including the switching power supply device.
Figure 10:
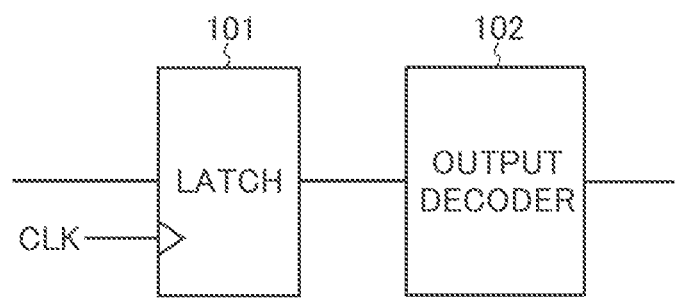
FIG. 10 is a block diagram illustrating one structural example of a general logic circuit.
Figure 11:
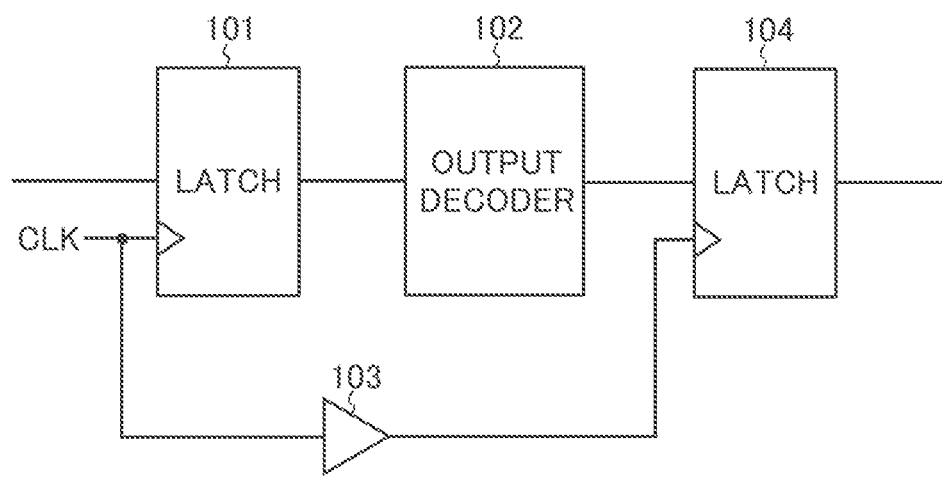
FIG. 11 is a block diagram illustrating another structural example of a general logic circuit.

FIG. 8 is a block diagram illustrating one structural example of a TV set including the switching power supply device described above. Further, FIGS. 9A to 9C are respectively a front view, a side view, and a rear view of the TV set including the switching power supply device described above. A TV set A of this structural example includes a tuner unit A1, a decoder unit A2, a display unit A3, a speaker unit A4, an operation unit A5, an interface unit A6, a control unit A7, and a power supply unit A8.

The tuner unit A1 tunes a broadcast signal of a desired channel from a reception signal received by an antenna A0 connected externally to the TV set A.

The decoder unit A2 generates a video signal and a sound signal from the broadcast signal tuned by the tuner A1. Further, the decoder unit A2 also has a function of generating the video signal and the sound signal on the basis of an external input signal from the interface unit A6.

The display unit A3 produces images from the video signal generated by the decoder unit A2.

The speaker unit A4 produces sound from the sound signal generated by the decoder unit A2.

The operation unit A5 is one of human interfaces, which accepts user's operations. As the operation unit A5, buttons, switches, a remote controller, and the like can be used.

The interface unit A6 is an front-end that accepts external input signals from an external device (such as an optical disc player or a hard disk drive).

The control unit A7 integrally controls operations of the individual units A1 to A6 described above. As the control unit A7, a central processing unit (CPU) or the like can be used.

The power supply unit A8 supplies power to the individual units A1 to A7. As the power supply unit A8, the switching power supply device described above can be appropriately used.

Note that the switching power supply device described above is not limited to the power supply device mounted in the TV set, but can be used as a power supply device (such as a power supply device for a system-on-chip (SOC) or a peripheral device) mounted in various electronic devices such as a liquid crystal display, a plasma display, a BD recorder/player, a set-top box, and a personal computer.

5. Others

Other than the embodiments described above, the structure of the present invention can be variously modified within the scope of the invention without deviating from the spirit thereof. In other words, the embodiments described above are merely examples in every aspect, and should not be interpreted as limitations. The technical scope of the present invention is defined not by the above description of the embodiments but by the claims, and should be understood to include all modifications within meanings and scopes equivalent to the claims.

Although the event trigger manager 2 detects an event occurrence on the basis of an input signal level in the first embodiment and the second embodiment described above, it may be possible to adopt a structure in which the event trigger manager 2 detects an event occurrence on an input signal edge. However, in view of facilitating the detection without missing other events occurring in the hold period and after the hold period is released, it is preferred to adopt the structure in which the event trigger manager 2 detects an event occurrence on the basis of an input signal level.

Although the reset signal RST is generated in the first embodiment and the second embodiment described above, it may be possible to adopt a structure in which the reset signal RST is not generated. Further, although a single clock pulse is generated during one hold period in the first embodiment and the second embodiment, it may be possible to adopt a structure in which a plurality of clock pulses are generated in one hold period if a plurality of dock pulses are necessary for the latch operation by the latch 6.

The logic circuit constituted of the latch 6, the output decoders 7 and 8, and the output multiplexer 9 may be used for other sequence circuit without limiting to the sequence circuit 10 described above. Note that the logic circuit constituted of the latch 6, the output decoders 7 and 8, and an output multiplexer 9 can be appropriately applied particularly to the sequence circuit 10 described, in which the latch 6 has little chance to perform the latch operation, and a sequence circuit using a gated clock signal

LIST OF REFERENCE SIGNS 1 sequence circuit according to the first embodiment
2 event trigger manager
3 delay unit
4 event handler
5 state decoder
6 latch
7, 8 output decoder
9 output multiplexer
10 sequence circuit according to the second embodiment
A TV set
A0 antenna
A1 tuner unit A2 decoder unit
A3 display unit
A4 speaker unit
A5 operation unit
A6 interface unit
A7 control unit
A8 power supply unit

The invention claimed is:

1. A sequence circuit comprising:
a detector arranged to detect an occurrence of an event on the basis of an input signal;
an acceptor arranged to accept the event whose occurrence has been detected by the detector;
an inhibitor arranged to inhibit the acceptor from accepting another event for a first period using the acceptance of one event by the acceptor as a trigger;
a clock pulse generator arranged to generate one or more clock pulses during a period after a second period shorter than the first period elapses from the start of the first period until the first period ends;
a determiner arranged to determine a next state on the basis of a current state and the event accepted by the acceptor; and
a latch arranged to latch the next state using the clock pulse, wherein
an output of the latch is the current state, and
wherein the clock pulse generator changes a length of the second period in accordance with an operating environment temperature of the sequence circuit.

2. The sequence circuit according to claim 1, wherein an occurrence timing of the event is not synchronized with any clock signal.

3. The sequence circuit according to claim 1, wherein the inhibitor inhibits the acceptor from accepting every event after an end of the first period until a third period elapses.

4. The sequence circuit according to claim 1, wherein the detector detects a type of the event on the basis of the current state and a state of the input signal, and informs the acceptor of the type of the event.

5. The sequence circuit according to claim 1, wherein the second period is longer than a setup time of the latch.

6. The sequence circuit according to claim 5, wherein the second period is longer than a total time of a time necessary for decay of a metastable state of the acceptor and the setup time of the latch.

7. The sequence circuit according to claim 1, wherein the detector detects the occurrence of the event on the basis of a level of the input signal.

8. A power supply control circuit arranged to control a state of a switching power supply device, the power supply control circuit comprising a sequence circuit, wherein the sequence circuit comprises:
a detector arranged to detect an occurrence of an event on the basis of an input signal;
an acceptor arranged to accept the event whose occurrence has been detected by the detector;
an inhibitor arranged to inhibit the acceptor from accepting another event for a first period using the acceptance of one event by the acceptor as a trigger;
a clock pulse generator arranged to generate one or more clock pulses during a period after a second period shorter than the first period elapses from the start of the first period until the first period ends;
a determiner arranged to determine a next state on the basis of a current state and the event accepted by the acceptor; and
a latch arranged to latch the next state using the clock pulse, and wherein
an output of the latch is the current state.

9. The power supply control circuit according to claim 8, wherein the clock pulse generator changes a length of the second period in accordance with an input voltage of the switching power supply device.

10. A switching power supply device comprising:
the power supply control circuit according to claim 8; and
a switch output stage arranged to generate an output voltage of the switching power supply device from an input voltage of the switching power supply device.

11. The power supply control circuit according to claim 8, wherein an occurrence timing of the event is not synchronized with any clock signal.

12. The power supply control circuit according to claim 8, wherein the inhibitor inhibits the acceptor from accepting every event after an end of the first period until a third period elapses.

13. The power supply control circuit according to claim 8, wherein the detector detects a type of the event on the basis of the current state and a state of the input signal, and informs the acceptor of the type of the event.

14. The power supply control circuit according to claim 8, wherein the second period is longer than a setup time of the latch.

15. The power supply control circuit according to claim 8, wherein the second period is longer than a total time of a time necessary for decay of a metastable state of the acceptor and the setup time of the latch.

16. The power supply control circuit according to claim 8, wherein the detector detects the occurrence of the event on the basis of a level of the input signal.

17. The power supply control circuit according to claim 8, wherein the clock pulse generator changes a length of the second period in accordance with an operating environment temperature of the sequence circuit.

* * * * *